United States Patent [19]

Gibson et al.

[11] Patent Number: 5,530,373

[45] Date of Patent: Jun. 25, 1996

[54] METHOD AND APPARATUS FOR DETERMINING AND SELECTIVELY DISPLAYING VALID MEASUREMENT INFORMATION

[75] Inventors: Robert T. Gibson, Snohomish; Paul H. Heydron, Everett, both of Wash.

[73] Assignee: Fluke Corporation, Everett, Wash.

[21] Appl. No.: 376,942

[22] Filed: Jan. 20, 1995

[51] Int. Cl.$^6$ .................................................. G01R 23/16
[52] U.S. Cl. .................. 324/758; 324/76.11; 324/115; 395/140; 364/483; 364/482; 341/120
[58] Field of Search ............................ 324/115, 77, 115, 324/130; 364/483, 482; 341/120, 139; 395/140, 142; 377/24

[56] References Cited

U.S. PATENT DOCUMENTS

| | | | |
|---|---|---|---|
| 4,532,470 | 7/1985 | Wiesmann | 324/76 |
| 4,663,586 | 5/1987 | Swerlein et al. | 324/115 |
| 5,012,181 | 4/1991 | Eccleston | 324/74 |
| 5,127,035 | 6/1992 | Ishii | 377/24 |
| 5,138,252 | 8/1992 | Ferguson | 324/778 |
| 5,142,221 | 8/1992 | Meldrum et al. | 324/115 |

*Primary Examiner*—Kenneth A. Wieder
*Assistant Examiner*—Barry C. Bowser

[57] ABSTRACT

An electronic test instrument adapted for displaying only meaningful information notwithstanding the intermittent arrival of valid input signals due to probing operations is provided. Two independent measurement processes measure the input signal simultaneously. The first measurement process operates in a similar fashion to a digital storage oscilloscope (DSO) by successively sampling the input signal to produce waveform information which are selectively sent to an LCD display device which graphically displays the waveform. The second measurement process continually performs a stability assessment of the input signal by collecting a series of stability measurements of a selected input signal parameter, creating a moving average of the series, and comparing each new stability measurement to the moving average relative to stability criteria. The stability decision controls the flow of waveform information to the display, thereby ensuring that only meaningful information is displayed based on waveform scans conducted when the input signal is stable.

13 Claims, 11 Drawing Sheets

METHOD AND APPARATUS FOR DETERMINING AND SELECTIVELY DISPLAYING VALID MEASUREMENT INFORMATION

BACKGROUND OF THE INVENTION

This invention relates generally to electronic test instruments and in particular to a method for displaying only valid information by independently determining the validity of the signal being measured and responsively controlling the flow of measurement information to the instrument display.

Electronic measuring instruments are designed to aid in the troubleshooting and analysis of electronic circuits and systems. Such instruments include digital multimeters, oscilloscopes, and frequency timer/counters. The multimeter provides numerical information on voltage, current, resistance, temperature, and other parameters present at the probe tips. The oscilloscope provides a visual display of the signal waveform. The frequency timer/counter provides information on the frequency, periods, duty cycle, and other parameters present at the probe tips.

These instruments share the common design feature of having a pair of test probes for coupling the instrument to the nodes of a device under test. A design goal of the manufacturers of such instruments has been to provide the user with meaningful information regarding the parameter of interest. Meaningful information is information shown on the instrument display that accurately represents the condition of the valid, intended signal at the probes of the test instrument, free of extraneous disturbances. The display of information that is not meaningful is undesirable because it tends to mislead or confuse the user and requires an extra judgment as to whether the displayed information is indeed valid.

Recent trends in instrument designs spurred by changes in the electronics test market have resulted in portable test instruments that contain more functionality. The digital multimeter, oscilloscope, and frequency timer/counter having been combined into one portable, electronic test instrument which is optimized for service and repair applications. While the focus of the instrument designer is still on getting only meaningful information displayed, the working conditions of the instrument user have shifted. Many service and repair applications must be performed 'on site', rather than on a service bench in a repair facility.

The basic measurement process consists of the user acquiring a signal from the device under test and interpreting the meaningful information displayed by the test instrument. The device under test must be probed for signals often in physically cramped positions or in the presence of hazardous voltages, requiring the full attention of the user and often the use of both hands to manipulate the probes. The user must focus on first getting the proper contact with the instrument probes to the device being tested and then on interpreting the information displayed on the test instrument. To facilitate this two-step process of acquiring measurement data and then analyzing the information, the test instrument must be able to distinguish between invalid data, for example, when the probes are not in contact with a desired signal source, and valid measurement data, when meaningful information may be collected and displayed without physical intervention by the user. Valid measurement data may be obtained from a stable signal, which is defined as the continuous presence of the intended signal from the device under test during the relevant measurement period. The relevant measurement period is the predetermined time period in Which the test instrument is making measurements of the input signal. Measurements taken on a stable signal are thus valid and provide meaningful information. Conversely, an unstable signal is one that occurs during any lack of continuous contact by one or both probes resulting in the absence of the intended signal at any time during the relevant measurement period. Measurements taken on an unstable signal are invalid and provide information that is not meaningful and possibly confusing.

A method of displaying only meaningful measurement information must be able to distinguish three scenarios found during probing. First, the method must be able to distinguish invalid data when the probes are not in contact with an intended signal. Second, the method must distinguish invalid data when the probes first come into contact with the signal source because the signal is present only during a fraction of a regular measurement cycle in the test instrument, thereby producing an incomplete and possibly misleading measurement. Finally, the method must distinguish when the probes are removed from contact with the signal source to reject a measurement that is invalid because the signal is present only during a fraction of the regular measurement cycle thereby corrupting that measurement. By making the decisions in a correct and timely manner, meaningful information is thus maintained on the instrument display for the user.

A digital multimeter displays a selected measurement parameter, such as the voltage present between its probes, one measurement at a time. A primary tool of the service and repair technicians for many years, digital multimeters were the first instruments where displaying meaningful data for the user who must focus on probing as described above became an issue. The Touch-Hold™ feature of the Fluke 80-series digital multimeters is a stability determining method designed to hold a stable reading on the display until a new stable reading is encountered. The Touch-Hold™ function is the commercial embodiment of the method and apparatus disclosed in U.S. Pat. No. 4,532,470, READING SENDING METER, Jul. 30, 1985, to Thomas W. Wiesmann and assigned to Fluke Corporation. In accordance with the '470 patent, measurement data reasonably close to a predetermined zero level indicate the probes are not connected, the data are rejected as presumptively invalid, and the display is not updated. When the instrument probes contact a signal, an algorithm determines whether the measurement data are stable by comparing the incoming measurement data with upper and lower tolerance limits centered around a last stable measurement value. If the measurement data are within the tolerance limits, they are stable and the display is not updated. If the measurement data are outside the tolerance limits, the display is updated with the new measurement data, and the upper and lower tolerance limits are re-centered around the new measurement data as the last stable measurement value. The user is then free to remove the probes from the device under test and interpret the displayed information because the digital multimeter continues to display the last stable measurement data.

This method suffers from the disadvantage that it is not able to adapt to the speed of variation of the input signal to better discriminate unstable and stable signals. This disadvantage is most severe for slowly varying signals that may otherwise be considered stable. In this case, the input signal level slowly drifts outside the tolerance band, causing the display to update and the tolerance limits to be re-centered. Therefore, it would be desirable to provide a method of determining the stability of the signal that adapts to the speed of variation of the input signal so that slowly varying signals may be tracked and still be considered stable while allowing more rapid adjustment to input signals with a larger variation.

The digital storage oscilloscope (DSO) operates in a more complex fashion than the digital multimeter. Instead of one reading per measurement, the (DSO) collects a series of readings, referred to as a "waveform scan", at a predetermined rate in response to a trigger signal. In a process known as digital sampling, a waveform memory is filled with sample data from the input signal which are collected at a rate typically much higher than the measurement rate of a digital multimeter but at lower measurement resolution. The contents of the waveform memory can then be plotted to the instrument display, which may be liquid crystal display (LCD) or cathode-ray tube (CRT) for example, to display the waveform information to the user.

While all DSO's have a trigger control that can be set to selectively trigger only in the presence of a specified signal voltage level, such a trigger control typically does not have the necessary capability to distinguish valid from invalid data under the three probing scenarios discussed above to prevent the display of meaningless information. The problem of displaying only a meaningful waveform with a DSO is that a waveform is by nature dynamic over a short time period. For example, one cycle of a sine wave has an upper and a lower peak, making detection of invalid data collected during a scan over a relatively short time interval very difficult. A signal that is valid at the beginning of a scan may become invalid before the scan is finished, resulting in information being displayed that is not meaningful to the user.

A portable, electronic test instrument incorporating the measurement functions of a DSO, a frequency counter, and a DMM has been designed. The measurement functions may be conducted independently and simultaneously to produce separate signal parameter measurements of the same signal. Therefore, it would be desirable to provide a test instrument capable of measuring a parameter of a signal while independently measuring a second parameter of the signal to make a determination of its stability according to a stability determining method. In this way, only meaningful waveform information from the measurement would be displayed notwithstanding the intermittent coupling and decoupling of the test instrument to the signal during probing operations by the user.

SUMMARY OF THE INVENTION

In accordance with the present invention, a method and apparatus for displaying meaningful waveform information while rejecting invalid data related to the transitory presence of the desired signal obtained during probing operations is provided. An input signal derived from the test probes is fed to measurement circuitry which includes a fast analog to digital converter (ADC) and a slow ADC which independently make measurements of the input signal as first and second measurement processes respectively. The output of the slow ADC is in the form of digital measurement data which may be in units of d.c. voltage or current, a.c. voltage or current, or other signal parameters depending on the configuration of the instrument. The digital measurement data is collected by a microprocessor which uses the data to make stability decisions at predetermined intervals of time. At each time interval, the collected data is analyzed to determine the running average as well as the upper and lower stability limits based on the running average of the collected digital measurement data of the data are within the upper and lower stability limits, the decision is reached that the data are stable over that time interval. Conversely, if data fall outside the stability limits, the decision is reached that the data are unstable over that time interval.

The fast ADC, together with associated time base, trigger, and memory circuitry, comprise a digital storage oscilloscope (DSO) which performs a first measurement process and is coupled to the same input signal being measured by the slow ADC. The fast ADC also generates digital measurement data described herein as samples. The samples from the fast ADC are similar to the samples from the slow ADC, except that a measurement of fast ADC information consists of predetermined number of samples comprising a waveform measurement or "scan" of the input signal. Each waveform scan is fed to one of three waveform memory buffers.

A stability decision ensures that the instrument displays only meaningful information, allowing a scan to begin only if the present stability decision indicates stable data. If an unstable decision is encountered during a scan, the present scan is reset and the most recent valid display is retained. At the end of a scan, the display is updated with the contents of a waveform buffer containing the most recent scan only if the present decision is stable. In this way, the user may acquire a signal from the device under test, remove the test probes from the device under test and interpret the valid, meaningful information displayed on the instrument.

One object of the present invention is to provide a method and apparatus for displaying only meaningful measurement information using an independent measurement process to detect when the input signal is stable and to display only valid measurements while rejecting the results of invalid measurements.

Another object of the present invention is to provide independent measurement processes wherein one measurement process provides stability decisions which control the display of information from the second measurement process to ensure that the second measurement process produces only meaningful measurement information.

An additional object of the present invention is to provide a method and apparatus for displaying only meaningful information by rejecting invalid measurement data which occurs during placement of test probes onto a device under test and to maintain the meaningful information on the instrument display upon :removal of the test probes from the device under test.

A further her object of the present invention is to provide a method for determining the stability of a signal while adaptively adjusting its response time according to the relative stability of the signal to provide a faster determination of signal stability after placement of probes onto a device under test.

Other features, attainments, and advantages will become apparent to those skilled in the art upon a reading of the following description when taken in conjunction with the accompanying drawings.

DETAILED DESCRIPTION OF THE INVENTION

Figure 1:
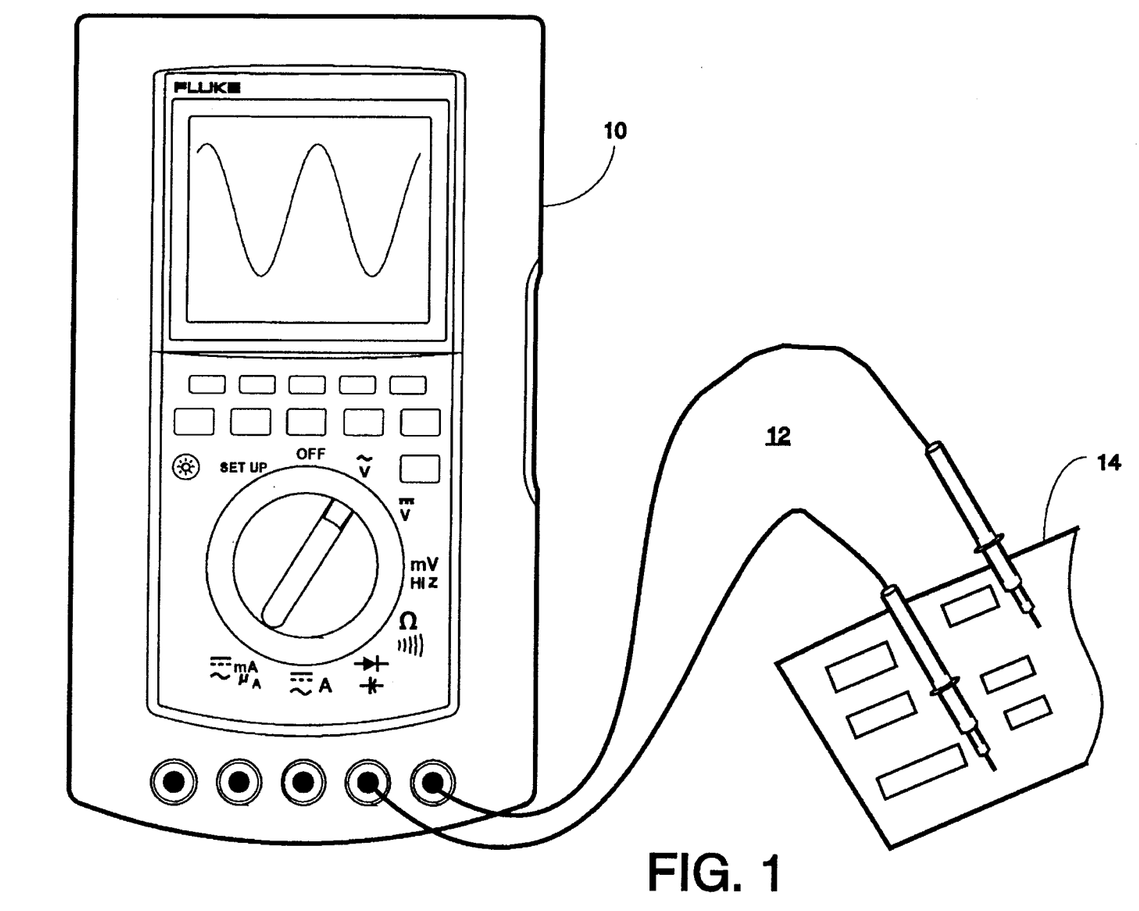
FIG. 1 is an illustration of an electronic test instrument having test probes and a graphical waveform display which displays only meaningful waveforms according to the present invention.

Referring now to FIG. 1, a portable, electronic test instrument 10 is adapted for measuring and displaying a variety of electrical parameters, such as voltage, current, resistance, capacitance, and frequency. The parameters may be displayed numerically or graphically. A pair of test probes 12 is coupled to the instrument 10 to selectably connect the instrument 10 to a device under test (DUT) 14. Both of the test probes 12 must be coupled to desired nodes on the DUT 14 in order for the instrument 10 to receive a signal, perform desired measurements, and display meaningful information. Because the user of the instrument often must focus on getting the probes 12 coupled to desired nodes of the DUT 14, the instrument 10 must be capable of detecting when stable data is being received and only then to update the display with meaningful information. Conversely, the instrument 10 must be capable of detecting when the test probes 12 are not coupled to the DUT 14 or when the test probe coupling occurs during a measurement cycle so that the resulting undesired information, which may cause confusing or otherwise meaningless information based on corrupted measurement data, is rejected. When the test probes 12 are lifted off the DUT 14, the flow of valid information to instrument 10 is interrupted. Instrument 10 detects the interruption, stops the measurement and holds the display of the last valid measurement so that the user may view only meaningful measurement information.

Figure 2:
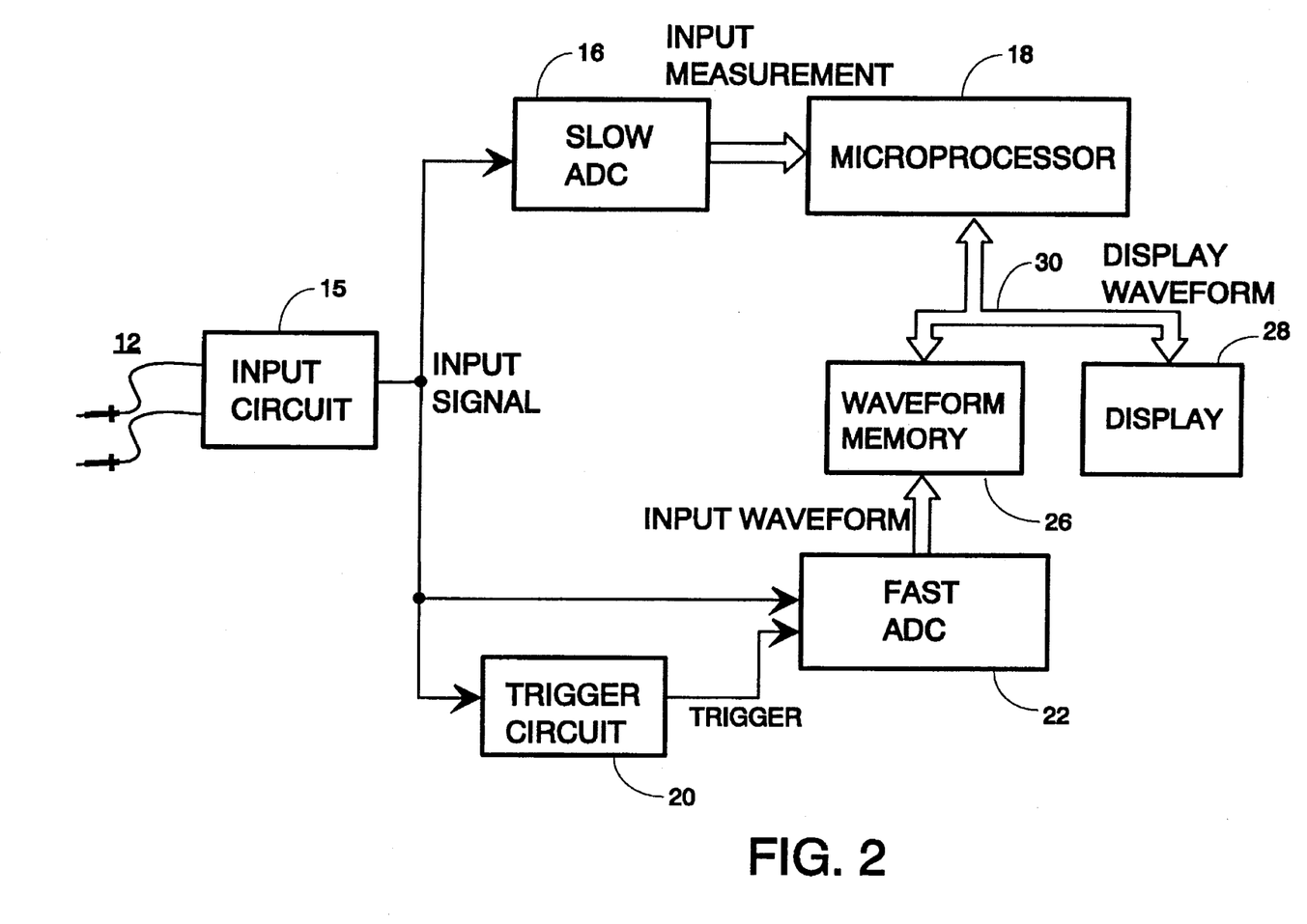
FIG. 2 is a simplified block diagram of the electronic test instrument of FIG. 1 that illustrates various aspects of the present invention.

FIG. 2 is a simplified hardware block diagram of the instrument 10 illustrating the relationship of the relevant instrument subsystems according to a preferred embodiment of the present invention. The test probes 12 (shown in FIG. 1) are coupled to an input circuit 15 which may be comprised of attenuators, amplifiers, filters, and other signal conditioning and switching circuitry adapted to convert the signal present at the test probes 12 into a desired signal labeled INPUT SIGNAL which is suitable for measurement. Input circuit 15 may also comprise an r.m.s. (root mean square) converter which is a circuit well known in the test and measurement field to convert an a.c. (alternating current) signal into a d.c. (direct current) signal corresponding to the r.m.s. value of a.c. signal.

The INPUT SIGNAL provided by the input circuit 15 is further coupled to a trigger circuit 20 and an input of an analog-to-digital converter (ADC) 22. The trigger circuit 20 generates trigger signals responsive to the voltage behavior of the INPUT SIGNAL and is programmable by the user to optimize the trigger point for a given INPUT SIGNAL. An output of the trigger circuit 20 is coupled to a trigger input of the ADC 22. ADC 22 converts voltage samples of the INPUT SIGNAL into a series of digital measurement values which comprise a waveform scan which together comprise an INPUT WAVEFORM. This operation comprises a first measurement process discussed more fully below.

The INPUT SIGNAL provided by the input signal circuit 15 is further coupled to an input of an ADC 16 which converts the voltage level of the INPUT SIGNAL into digital measurement data labeled INPUT MEASUREMENT at a predetermined sample rate. Each INPUT MEASUREMENT represents a single measurement in the preferred embodiment. An output of the ADC 16 is coupled to a microprocessor 18 which accepts the INPUT MEASUREMENT data and processes the data according to an instrument program to provide stability decisions. This operation comprises a second measurement process discussed more fully below.

An output of the ADC 22 is coupled to a waveform memory 26 which provides digital storage of each INPUT WAVEFORM as it is received from the ADC 22. The microprocessor 18 is coupled to the waveform memory 26 and to a display 28 via an interface bus 30 which includes both data and address paths. Microprocessor 18 communicates with devices on the interface bus, including the display 28 and the waveform memory 26, using techniques well known in the electronics field. In the preferred embodiment, display 28 comprises a pixel-addressable display module which uses liquid-crystal display (LCD) technology capable of graphically displaying waveform information. For some applications, the outputs of the ADC 16 and the ADC 22 may be coupled directly to the interface bus 30 rather than strictly as shown in the block diagram of FIG. 2. Responsive to the stability decisions being generated by the microprocessor 18 in a process discussed more fully below, the display 28 receives waveform data labeled DISPLAY WAVEFORM to display the desired waveform information under the control of the microprocessor 18. The appropriate DISPLAY WAVEFORM selected by the microprocessor 18 is a function of the stability determining process with the ultimate goal of displaying only those waveforms scanned during time periods when the INPUT SIGNAL is deemed to be stable. Because the stability decision process operates asynchronously from the waveform scan process, the relationship between the two processes cart best be understood via timing diagrams which incorporate both process states and process events.

In the preferred embodiment, all measurement activities in the instrument 10 are controlled by the microprocessor 18 which is executing an instrument control program. Each distinct activity is described as a process. Processes may operate independently and asynchronously from each other.

Inter-process communication may consist of polled process states, in which one process may passively obtain information from another process, and process events, where one process directly communicates to another process the occurrence of an event that requires immediate servicing. The process of measuring the INPUT WAVEFORM is collectively known as a WAVEFORM SCAN process in the instrument control program and the trigger signal may communicated to WAVEFORM SCAN process as an event. The trigger signal may be generated either by the trigger circuit 20 or by the microprocessor 18 as it executes the instrument control program.

Figure 3:
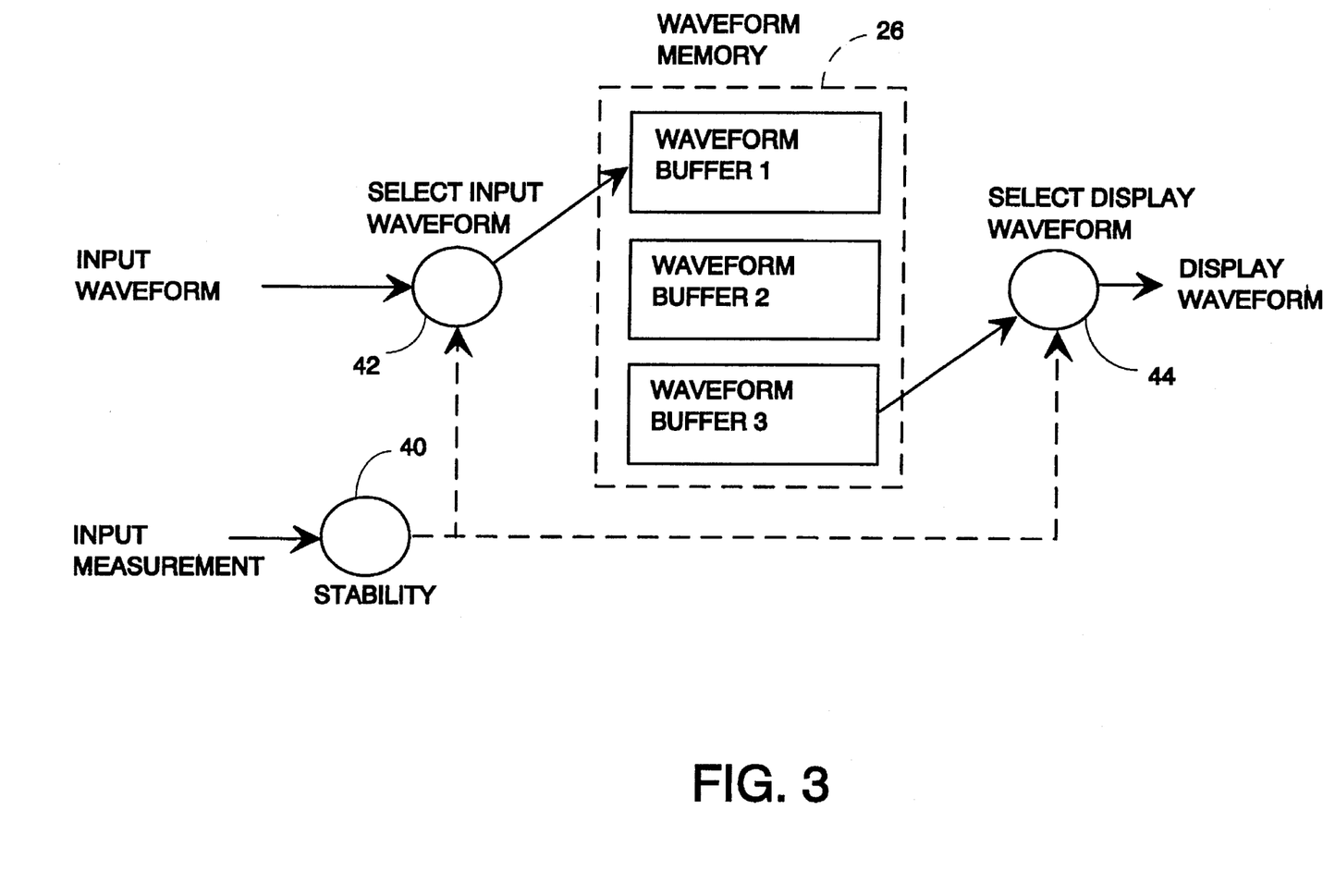
FIG. 3 is a block diagram illustrating the control of information flow via a stability determining process in accordance with a preferred embodiment of the present invention as performed by the electronic test instrument of FIG. 1.

FIG. 3 illustrates the relationship between various processes executed by the microprocessor 18 to control the flow of INPUT WAVEFORM data to the waveform memory 26 and the selection of the DISPLAY WAVEFORM to the display 28 (shown in FIG. 2). A process is a software subprogram executed by the microprocessor 18 which operates on a set of data in a predetermined manner. The INPUT MEASUREMENT data are received by a process 40 labeled STABILITY which collects a predetermined number of such measurements and arrives at a decision as to whether the INPUT SIGNAL is stable or unstable based on a stability algorithm which compares the present measurement to a series of past measurements which are used to calculate a moving average. The output of the STABILITY process 40 is coupled to a process 42 labeled SELECT INPUT WAVEFORM and a process 44 labeled SELECT DISPLAY WAVEFORM and includes a state that is checked by the processes 42 and 44 and also an event (not shown) that signals the processes 42 and 44 in case of a transition from a stable to an unstable condition.

The process 42 acts as a switch in directing the present INPUT WAVEFORM to a desired one of three waveform buffers that is contained within the waveform memory 26. The implementation of the selection may be accomplished in any of a number of ways well known in the electronics field. The waveform memory 26 is thus adapted to store the present INPUT WAVEFORM and a past INPUT WAVEFORM which is based on the measurement of the INPUT SIGNAL that was stable throughout the waveform scan. In the presently preferred embodiment of the present invention, waveform memory 26 comprises one contiguous memory block, with waveform buffers 1, 2, and 3 designated by address areas within the waveform memory 26. The selection of the desired waveform buffer 1, 2, or 3 by the process 42 is accomplished by the dynamic choice of address pointers which changes over successive scans.

The process 44 acts as a switch similar to process 42, designating the data in the desired waveform buffer as the appropriate DISPLAY WAVEFORM which is directed to the display 28 (shown in FIG. 2). In this way, the waveform buffers are dynamically selected by the processes 42 and 44 where the assignment of buffers continually changes between successive waveform scans.

In the preferred embodiment, three waveform buffers are used because of system speed considerations. At high sample rates, it is necessary to use one buffer for the present INPUT WAVEFORM data, a second buffer for the DISPLAY WAVEFORM data, and a third waveform buffer for immediate swap with the first buffer to receive the INPUT WAVEFORM data on completion of a scan because of time delays in the display 28 accepting the DISPLAY WAVEFORM data and the processes 42 and 44 reallocating the waveform buffers between successive scans. This architecture will readily support either a greater or fewer number of discrete buffers based on the particular needs of the application.

Figure 4:
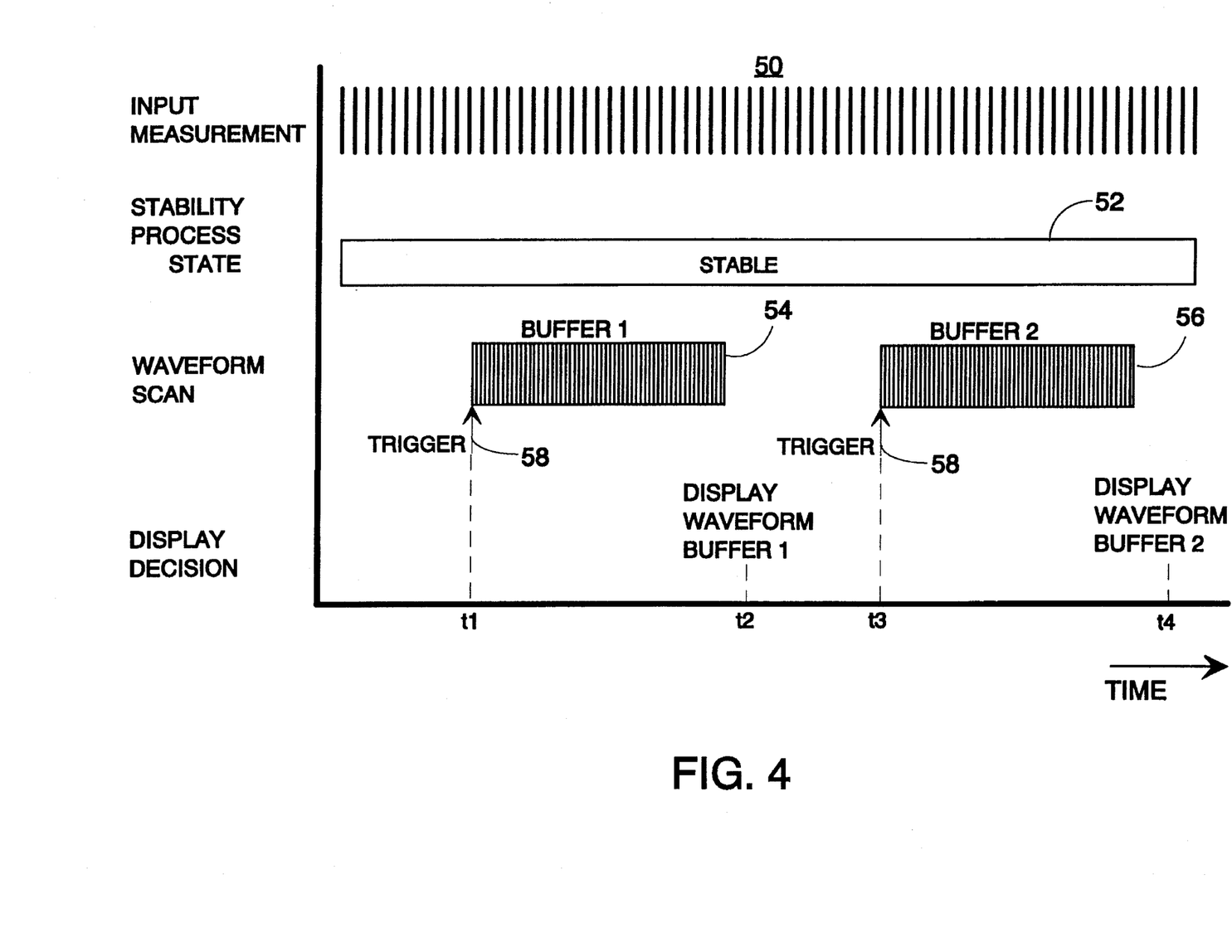
FIG. 4 is a timing diagram (not to scale) showing the relative relationships of various aspects of a measurement process for an input signal that is continuously stable.

FIG. 4 is a timing diagram that illustrates the relationships between various processes and information flow as measurements are collected according to the preferred embodiment of the present invention. The INPUT MEASUREMENT data generated by the ADC 16 (shown in FIG. 2) arrives at a predetermined rate as shown on the top trace of the graph by vertical lines 50, each of which correspond to the arrival of one data point at the process 40 (shown in FIG. 3). The DISPLAY WAVEFORM selected by the process 44 is stored in waveform buffer 3. INPUT MEASUREMENT data points are collected by the STABILITY process 40 to calculate a moving average as explained more fully below. The STABILITY process 40 compares the moving average with each new INPUT MEASUREMENT data point to generate a decision of either STABLE or UNSTABLE. The decision appears as an output state 52 which may be ascertained by any other process. As shown, the output state 52 remains stable indicating that the INPUT SIGNAL (shown in FIG. 2) is stable.

The WAVEFORM SCAN process which generates each INPUT WAVEFORM data set is shown next. If the present state of the STABILITY process 40 is STABLE and a TRIGGER event 58 from the trigger circuit 20 (shown in FIG. 2) is received at time t1, the WAVEFORM SCAN process begins and a predetermined number of data points are directed to waveform buffer 1 as shown by vertical lines 54 within a box labeled BUFFER1. When the WAVEFORM SCAN finishes, the waveform buffer containing the new information, in this case waveform buffer 1, is selected by the process 44 for the new DISPLAY WAVEFORM data as shown if the next decision output of the process 40 is stable, as shown at time t2. On receipt of the next TRIGGER event 58 at time t3, the next WAVEFORM SCAN begins with the INPUT WAVEFORM data now directed to waveform buffer 2 by the process 42 as shown by vertical lines 56 in the box labeled BUFFER 2. At time t4, the present state of STABILITY process 40 is stable, process 44 selects data inn waveform buffer 2 for the DISPLAY WAVEFORM and process 42 selects waveform buffer 3 to receive the next INPUT WAVEFORM data. In this way, as waveform scans continue during periods of stability, the waveform buffers selected by processes 42 and 44 continue to shift among the three waveform buffers in a coordinated fashion.

Figure 5:
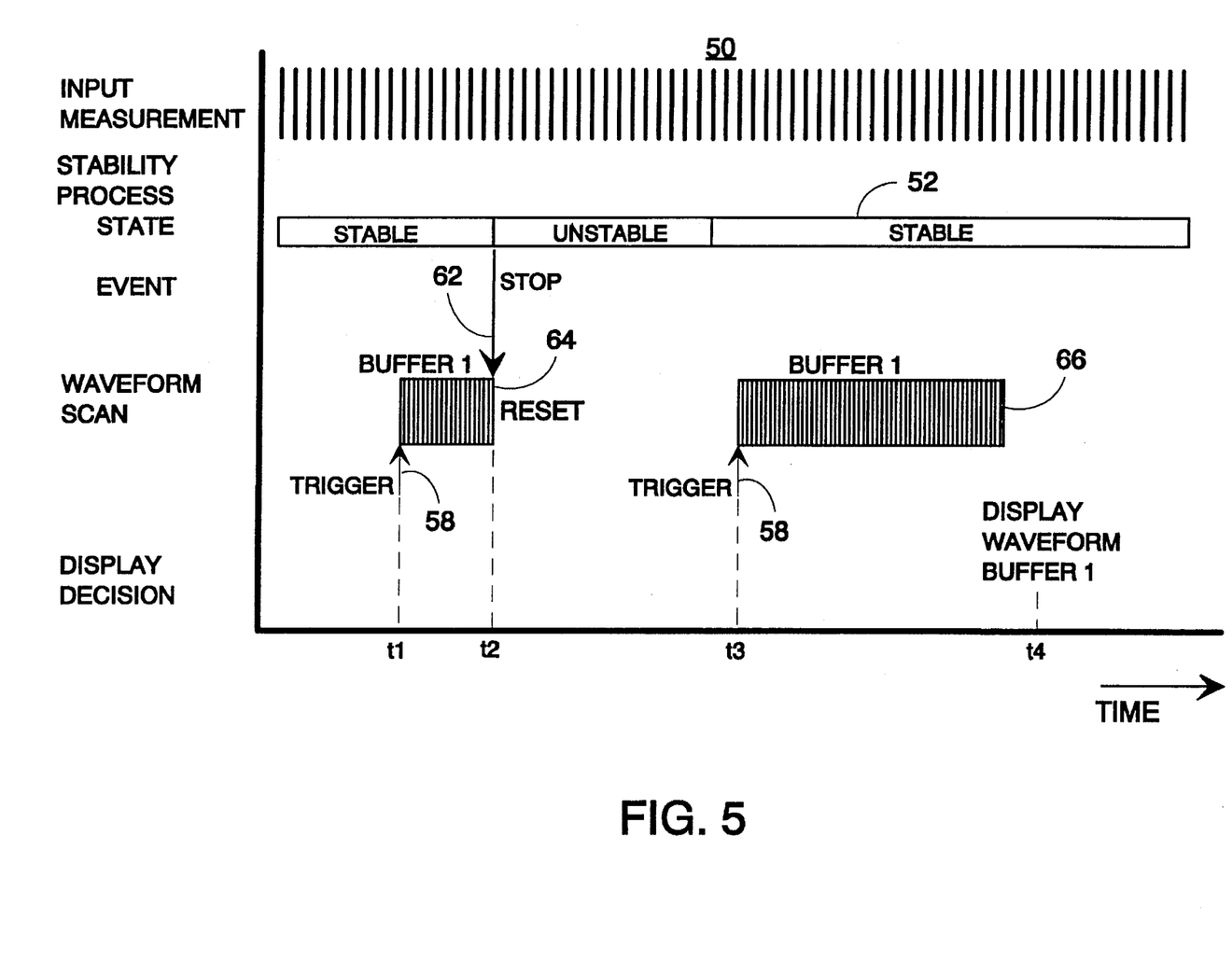
FIG. 5 is a timing diagram (not to scale) showing the relative relationships of various aspects of a measurement process for an input signal that has unstable points.

FIG. 5 is a timing diagram that illustrates the operation of the processes similar to that as shown in FIG. 4 except the output state 52 becomes unstable, a condition which occurs for example when the instrument probes 12 are not coupled to the device under test 14 (shown in FIG. 1 ). The INPUT MEASUREMENT data generated by the ADC 16 (shown in FIG. 2) arrives at a predetermined rate as shown on the top trace of the graph by vertical lines 50 as in FIG. 4. The various processes are designed to react in such a way as to ensure that any waveform scans collected during periods when the INPUT SIGNAL is unstable will not selected to be a DISPLAY WAVEFORM. At time t1, upon receipt of the TRIGGER event 58, the WAVEFORM SCAN process begins and a predetermined number of data points are directed to waveform buffer 1 as shown by vertical lines 64 within a box labeled BUFFER1. At time t2 during the scan, the STABILITY process 40 changes the output state 52 to unstable and generates an event 62 labeled STOP which tells the WAVEFORM SCAN process to cease and effect a reset of the scan process. The display is not updated and the DISPLAY WAVEFORM data remains in its previously selected waveform buffer which contains a valid waveform. In this way, if the probes 12 (shown in FIG. 1) are removed from the DUT 14, the instrument 10 displays meaningful information based on stable measurement data to the user with no manual intervention required.

The WAVEFORM SCAN process resumes upon receipt of the TRIGGER event 58 which occurs at time t13 and a predetermined number of data points are directed to waveform buffer 1 as shown by vertical lines 66 within the box labeled BUFFER1. At time t4, the output state 52 is stable and process 44 selects waveform buffer 1 for the DISPLAY WAVEFORM data and process 42 selects waveform buffer 2 to receive the next INPUT WAVEFORM data. In this way, only meaningful information is displayed by the instrument 10 after the probes 12 are first coupled to the DUT 14 by delaying the WAVEFORM SCAN process until the INPUT SIGNAL is stable.

Figure 6:
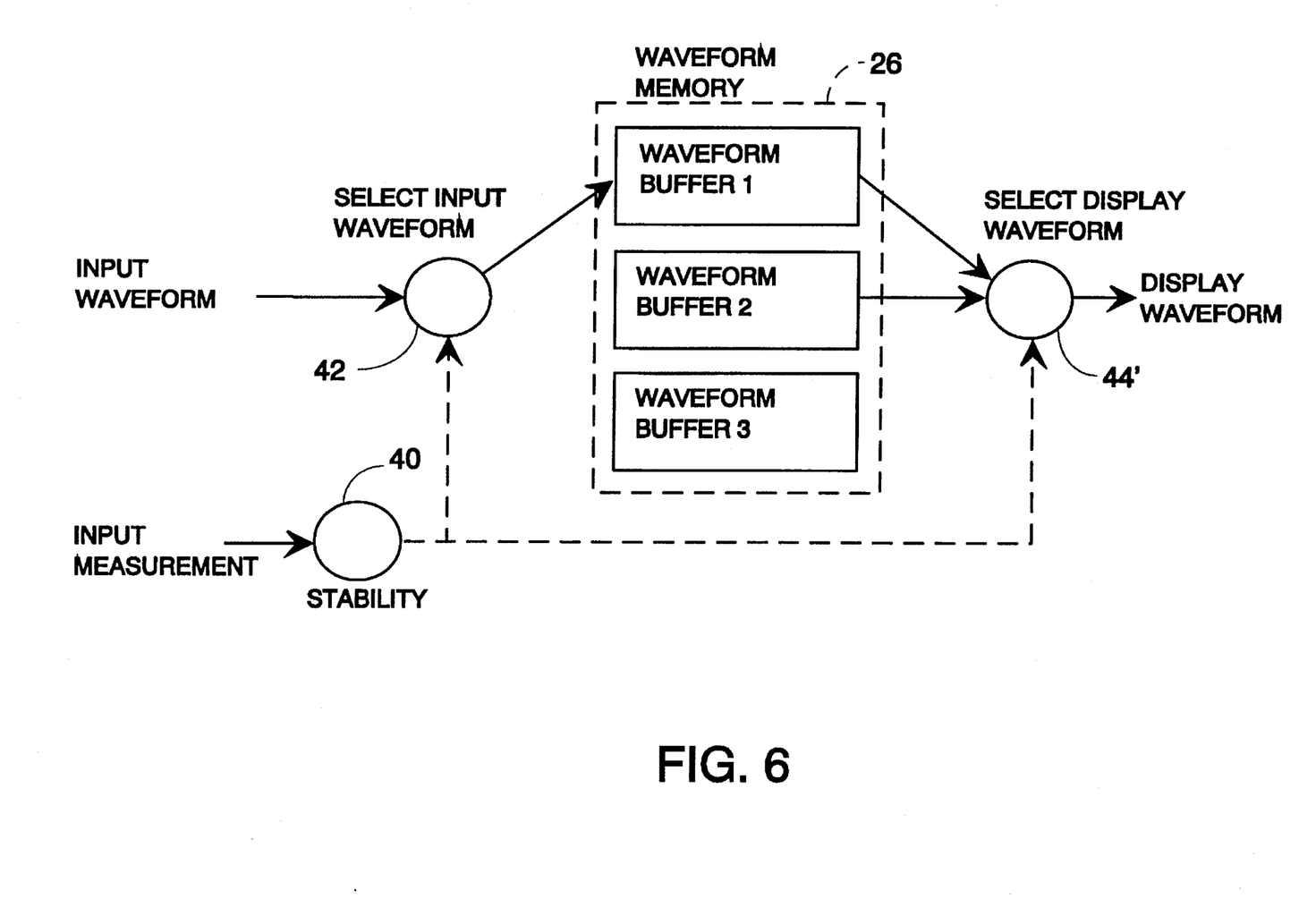
FIG. 6 is a block diagram illustrating the control of information flow via a stability determining process according to an alternative embodiment of the present invention which implements a roll mode.
Figure 7:
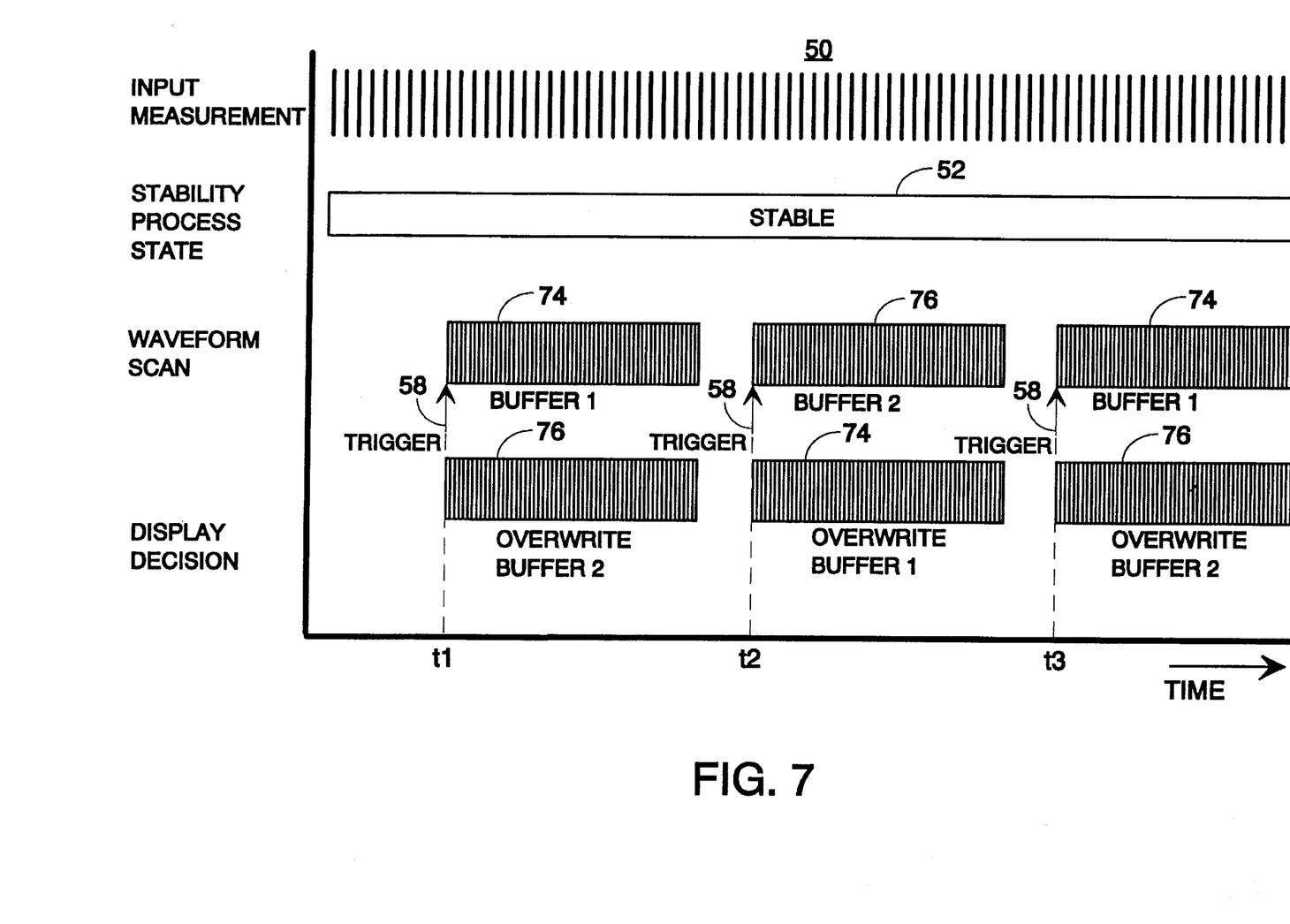
FIG. 7 is a timing diagram (not to scale) of the alternative process of FIG. 6 showing the relative relationships of various aspects of a measurement process for an input signal that is continuously stable.
Figure 8:
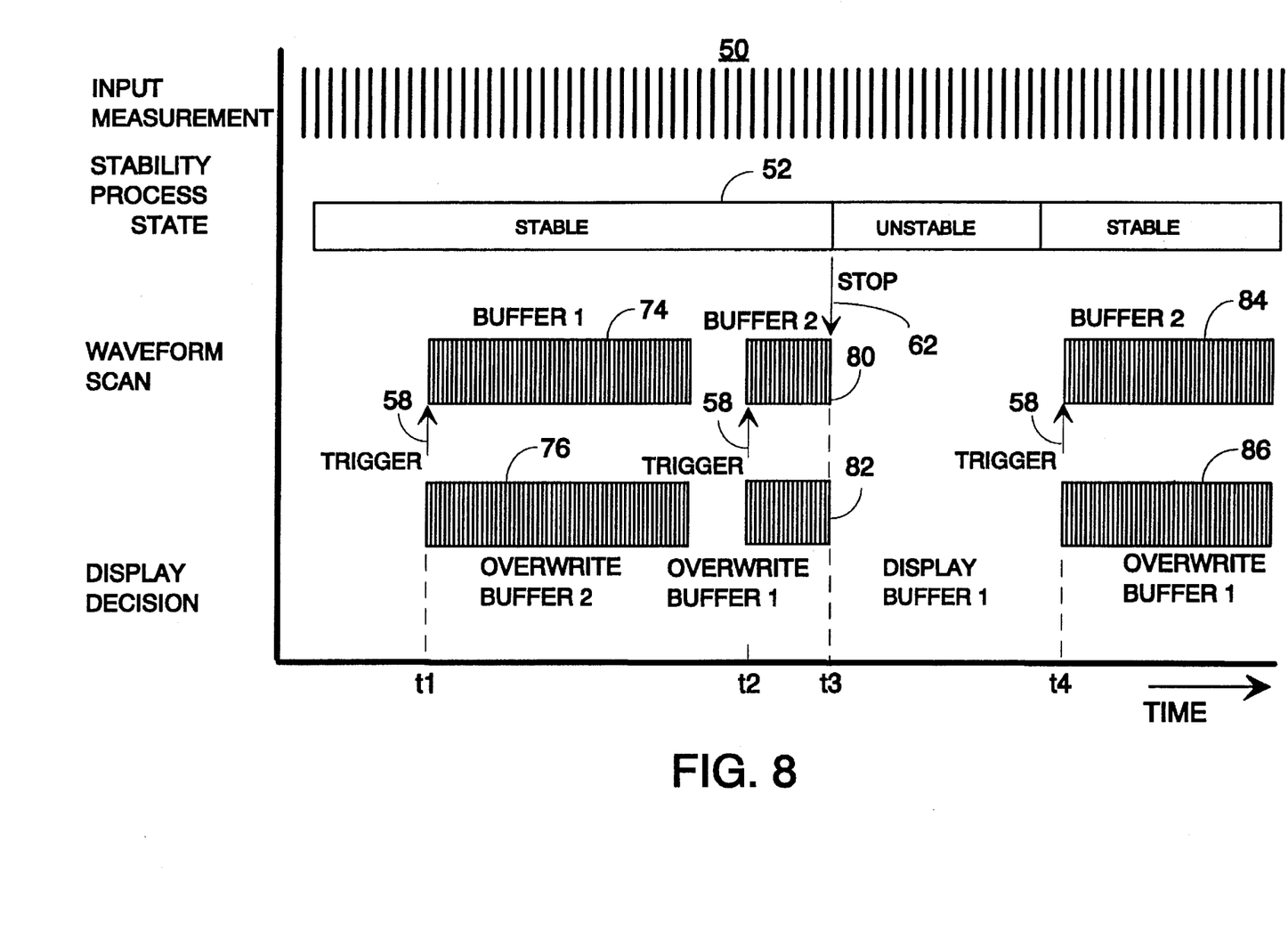
FIG. 8 is a timing diagram (not to scale) of the alternative process of FIG. 6 showing the relative relationships of various aspects of a measurement process for an input signal that has unstable points.

FIG. 6, FIG. 7, and FIG. 8 together illustrate an alternative embodiment of the present invention suitable for situations in which the sample rate performed during the WAVEFORM SCAN process is substantially lower than that of the preferred embodiment. When the sample rate is slower than a predetermined rate, the time to perform a complete WAVEFORM SCAN becomes significant, creating difficulties for the user who must otherwise wait for an update on his display. For example, when measuring a signal with a frequency of 1 Hertz, the time required to completely sample one cycle of the signal takes at least one second to complete. Rather than wait to update the instrument display at the end of the WAVEFORM SCAN as in the preferred embodiment, the display updates in the alternative embodiment occur as sample data become available at the output of the WAVEFORM SCAN process. This feature is commonly referred to as "roll mode," because the new DISPLAY WAVEFORM rolls gradually over the old DISPLAY WAVEFORM from left to fight across the display. In this way, the user can see the displayed waveform update immediately, point by point, rather than waiting until the end of the scan for the complete update. Even in roll mode, the processes that control the information flow according to the alternative embodiment do so in such a way as to prevent meaningless information from being displayed due to probing operations.

FIG. 6 illustrates the relationship between various processes executed by the microprocessor 18 in roll mode to control the flow of INPUT WAVEFORM data to the waveform memory 26 similar to the process as explained for FIG. 3. Roll mode is a display technique well known in the test and measurement field for digital storage oscilloscopes and is desirable for applications where the sample rate is relatively low, resulting in long time delays to complete a waveform scan which could result in confusion by the user if the displayed waveform were not updated on a simulated real-time basis. The user sees a waveform that updates from left to right in roll mode where the new waveform appears to roll over the previous waveform. The present invention is implemented in the alternative embodiment to ensure that only meaningful waveform information is displayed during roll-mode operation of the instrument 10.

In roll mode, a SELECT DISPLAY WAVEFORM process 44' provides pointers for two waveform buffers that together comprise the DISPLAY WAVEFORM data. At low sample rates, typically below 1,000 samples per second, it is preferable to use a first buffer to store the present INPUT WAVEFORM data while a second buffer is preferably used to hold the last stable INPUT WAVEFORM data. Both the first and second buffers are selected for the DISPLAY WAVEFORM data. As the first waveform buffer fills with INPUT WAVEFORM data, the individual arriving data points are selected as the DISPLAY WAVEFORM as long as the output state of the process 40 remains stable.

FIG. 7 is a timing diagram that illustrates the relationships between various processes and information flow as measurements are collected according to the alternative embodiment. The INPUT MEASUREMENT data arrive at a predetermined rate as shown on the top trace of the graph by vertical lines 50. As shown, the output state 52 of the STABILITY process 40 (shown in FIG. 6) remains stable. The previously completed waveform scan is as shown by vertical fines 74 within a box labeled BUFFER1. If the output state 72 is STABLE and the TRIGGER event 58 from the trigger circuit 20 (shown in FIG. 2) is received at time t1, the WAVEFORM SCAN process begins. During the WAVEFORM SCAN process, the new data points are selected by the process 44' (shown in FIG. 6) for the new DISPLAY WAVEFORM data as they arrive at BUFFER 1 if the output state 72 remains stable while displaying the remaining data in BUFFER 2 as shown by vertical lines 76 within a box labeled BUFFER2. In this way, the newly arrived data from the present WAVEFORM SCAN process appear to overwrite the previous data in BUFFER 2 although the actual data in BUFFER 2 remain undisturbed. If the output state 72 remains stable, as shown at time t2, the waveform buffers 1 and 2 are swapped by the processes 42 and 44' upon receipt of the TRIGGER event 58, with the new INPUT WAVEFORM data now being stored into BUFFER 2 as indicated by the vertical lines 76 and the old data remaining in BUFFER I as indicated by the vertical lines 74. The sequence then repeats itself starting at time t3 upon receipt of the TRIGGER event 58 as long as the output state 72 remains stable. In this way, the WAVEFORM SCAN processes continue with the waveform buffers selected by processes 42 and 44' shifting back and forth between BUFFER 1 and BUFFER 2 in a coordinated fashion.

FIG. 8 is a timing diagram that illustrates the operation of the processes similar to that shown in FIG. 7 under the alternative embodiment but during a period when the output state 72 is unstable, a condition which occurs for example when the instrument probes 12 are, not coupled to the device under test 14 (shown in FIG. 1). The various processes are designed to react in such a way as to ensure that any waveform scans collected during periods when the INPUT SIGNAL is unstable will not be selected to be a DISPLAY WAVEFORM. At time t1, the output state 72 is stable. Upon receipt of the TRIGGER event 58 at time t1, the WAVEFORM SCAN process begins with the data being stored in BUFFER 1 as indicated by the vertical lines 74. The process 44' begins to display the data indicated by the vertical lines 74 as the DISPLAY WAVEFORM data as it arrives, appearing to overwrite the data in BUFFER 2 indicated by the vertical lines 76. The WAVEFORM SCAN completes with the output state 52 still stable. The processes 42 and 44' (shown in FIG. 6) then swap the respective BUFFER 1 and 2 and, upon receipt of the TRIGGER event 58 at time t2, the WAVEFORM SCAN process continues.

At time t3 during the scan, the STABILITY process 40 changes its output state to unstable and generates the STOP event 62 which tells the WAVEFORM SCAN process to cease and reset. The process 44' reverts back to the last valid waveform scan which was stored in BUFFER 1, thereby rejecting the present INPUT WAVEFORM data in BUFFER 2 and displaying only meaningful information to the user collected during a period of stability. In this way, if the probes 12 are removed from the DUT 14 for example, the instrument 10 displays only meaningful information based on stable measurement data to the user.

When the output state 52 becomes stable again, the WAVEFORM SCAN process resumes upon receipt of the TRIGGER event 58 at time 14. At time t4, the process t4' begins to display the data indicated by the vertical lines 84 as the DISPLAY WAVEFORM data as it arrives, appearing to overwrite the data in BUFFER 2 indicated by the vertical lines 86. In this way, only meaningful information is displayed by the instrument 10 after the probes 12 are first coupled to the DUT 14 by delaying the WAVEFORM SCAN process until the INPUT SIGNAL is stable.

Figure 9:
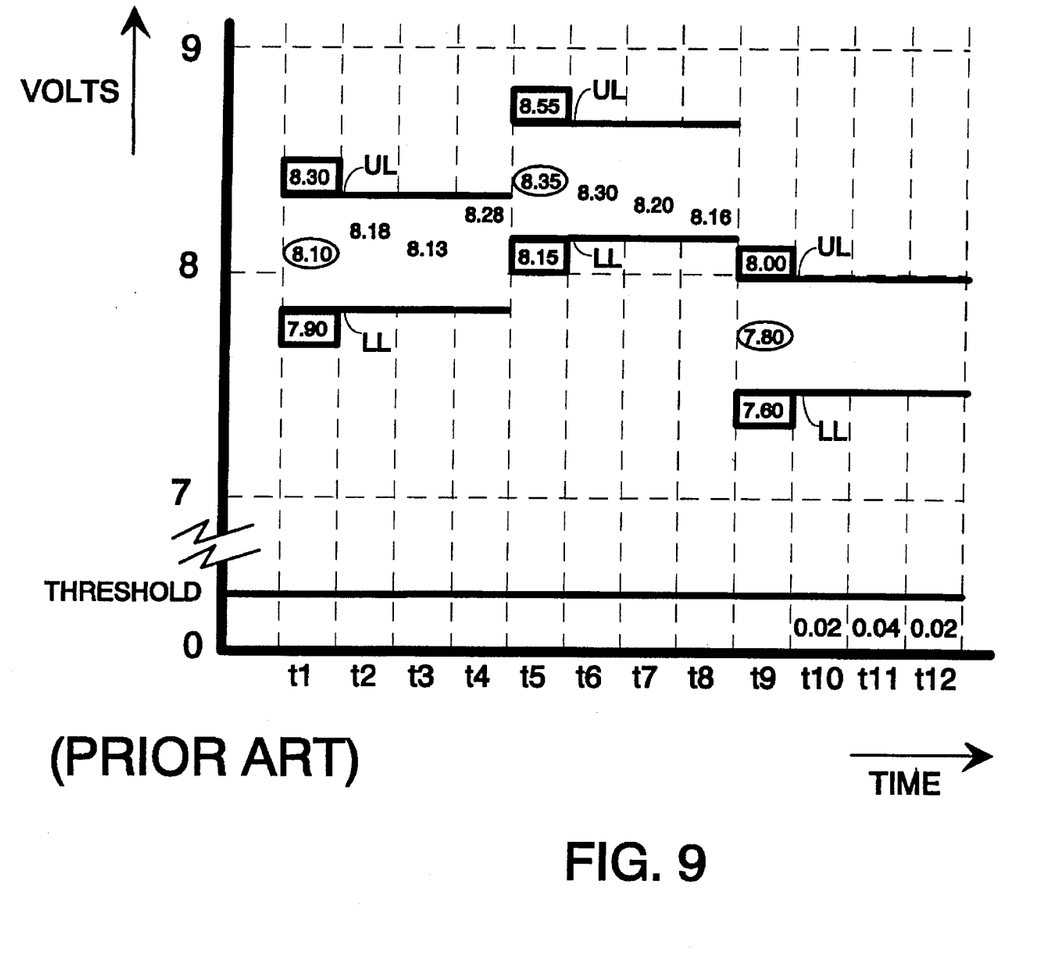
FIG. 9 is a timing diagram that illustrates a prior art stability determining process.

FIG. 9 is a graph of voltage versus time which illustrates the operation of a prior art stability determining process implemented as the Touch-Hold™ feature in the Fluke 80-series digital multimeters. The Touch-Hold™ function is the commercial embodiment of the method and apparatus disclosed in U.S. Pat. No. 4,532,470, (hereinafter the "'470 patent"), READING SENDING METER, Jul. 30, 1985, to Thomas W. Wiesmann and assigned to Fluke Corporation. The process of the '470 patent controls the flow of measurements from a single measurement process to a numerical instrument display. An upper limit (UL) and a lower limit (LL), which together comprise a stability band, are bracketed around the last displayed measurement value. Subsequent measurements that fall between UL and LL are considered stable and are discarded in order to reduce "display rattle." Display rattle involves minor differences between measurements which cause the numerical display to change but the changes themselves do not constitute meaningful information. Display rattle is undesirable because it presents a confusing display to the user. The width of the stability band is selected to reject display rattle while allowing for valid measurements which are sufficiently different to be displayed. Furthermore, subsequent measurements that fall below a predetermined THRESHOLD value are likewise discarded as invalid measurements in order to hold the last valid measurement on the display during the periods when the test probes 12 are not coupled to the DUT 14 (shown in FIG. 1).

A measurement is allowed to update the display only when it falls outside the stability band but above the THRESHOLD value, meaning a valid measurement has been received. At time t1, a new measurement of 8.10 volts is displayed as noted by the circle around the measurement value 8.10. The stability band is then centered around the measurement 8.10. The next three measurements 8.18, 8.18, and 8.28, which arrive at times t2, t3, and t4 respectively, are within the stability band and are therefore discarded. The circled measurement 8.35 at t5 is outside the stability band and is above the threshold level, thereby causing the display to be updated with 8.35 volts. In addition, the stability band is centered around the new measurement 8.35. Measurements 8.30, 8.20, and 8.16 arriving at t6, t7, and t8, respectively, are within the stability band and are discarded. The circled measmurement 7.80 at t9 is outside the stability band causing the display to be updated as 7.80 volts and the stability band to be centered around 7.80. Finally, the measurements 0.02, 0.04, and 0.02, arriving at t10, t11, and t12 respectively, are discarded because they are below the THRESHOLD level, leaving the measurement 7.80 on the display. In this way, only meaningful measurement information, defined as information that is not merely repetitive or cumulative and which is not below a predetermined threshold value, is displayed to the user during probing operations.

Figure 10:
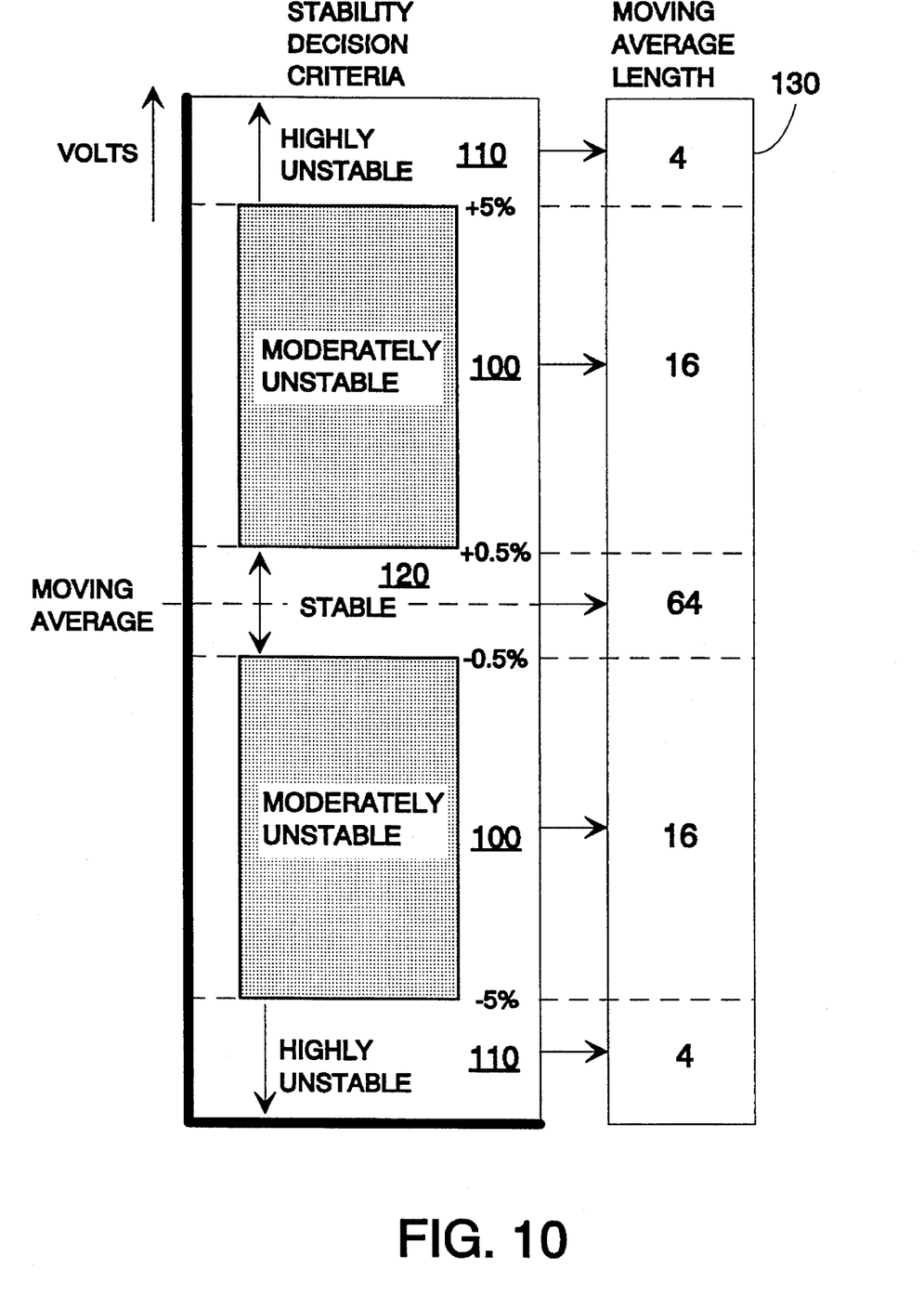
FIG. 10 is a diagram illustrating the construction of stability criteria according to the present invention.
Figure 11:
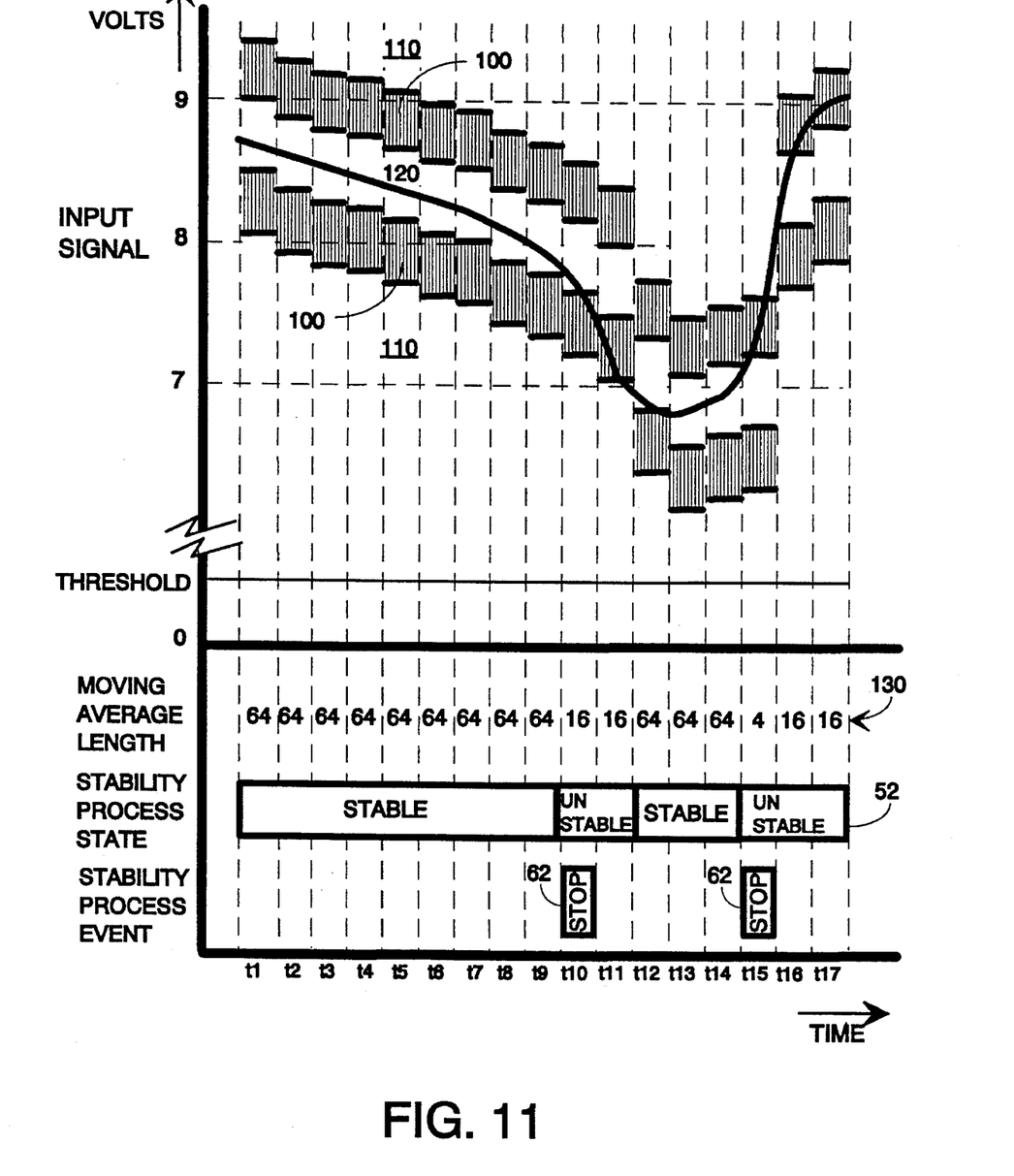
FIG. 11 is a timing diagram that illustrates the operation of the stability determining process according to the present invention.

FIG. 10 and FIG. 11 together illustrate the operation of the STABILITY process 40 (shown in FIG. 3) according to the present invention. The STABILITY process 40 is designed to determine whether the INPUT SIGNAL is stable or unstable by examining the stream of INPUT MEASUREMENT data that are collected. The STABILITY process 40 communicates with other processes, particularly the processes 42 and 44 (shown in FIG. 3) which control the selection of the DISPLAY WAVEFORM, along with the WAVEFORM SCAN process (shown in FIG. 4, 5, 7 and 8) to control the acquisition of the INPUT WAVEFORM.

FIG. 10 is a state diagram of the STABILITY process 40 (shown in FIG. 3) according to the present invention. Two concentric stability bands are employed, the inner stability band 100 labeled MODERATELY UNSTABLE and the outer stability band 110 labeled HIGHLY UNSTABLE, which distinguish the degree of instability of the present measurement. In accordance with the preferred embodiment of the present invention, the width of the stability bands 100 and 110 are fixed at 0.5% and 5% of the full scale measurement value respectively. The stability bands are centered around a moving average which is based on the average value of a predetermined number of previous measurements (the moving average length). For example, a moving average of length $\alpha$ is calculated by summing the last $\alpha$ measurements and dividing by $\alpha$. As each new measurement arrives, the oldest measurement is discarded and the moving average is recalculated based on the last $\alpha$ measurements.

A measurement falling within a stability band 120 labeled STABLE causes the stability process state 52 (shown in FIG. 4) to be stable. The stability bands 100, 110, and 120 thus comprise relative stability factors for each new measurement value. A subsequent measurement falling outside the STABLE region causes the stability process state 52 to be changed from stable to unstable and also causes the STOP event 62 indicating the change from stable to unstable to be generated which is communicated to the WAVEFORM SCAN process to terminate a waveform scan upon detecting an unstable INPUT SIGNAL.

The length of the moving average, that is, the number of individual measurements that make up the average, is determined by the degree of instability of the present measurement. The moving average length, shown as a set 130, is a set of predetermined lengths of 64, 216, or 4, depending on the which of the stability bands 100, 110, or 120 that the present measurement falls into. Successive measurements that all occur within the STABLE stability band 120 accrue to a moving average based on the last 64 stable measurements in order to more accurately center the stability bands around a stable signal. A measurement value that appears in the MODERATELY UNSTABLE stability band 100 causes the moving average length to be truncated to the last 16 measurement values so that the moving average may more quickly react to changes in the INPUT SIGNAL. Similarly, a measurement value that appears in the HIGHLY UNSTABLE region 110 causes the moving average to be truncated to the last 4 measurement values so that the moving average may respond even more quickly to changes in the INPUT SIGNAL. The typical situation for a HIGHLY UNSTABLE reading occurs when the test probes 12 (shown in FIG. 1) are initially placed on the DUT 14, causing a large step change in the INPUT SIGNAL level. In this case, it is desirable to provide a faster reaction time to obtain a stable output state 52 of the STABILITY process 40 so that the WAVEFORM SCAN process may begin as quickly as possible.

FIG. 11 is a graph (not to scale) showing the operation of the STABILITY process 40 according to the present invention in response to variations in the INPUT SIGNAL over time. The upper portion of the graph is a graphical representation of the voltage amplitude of the INPUT SIGNAL that is subsequently sampled and converted to digital samples which arrive at the STABILITY process 40 as the INPUT MEASUREMENT at each of the times t1–t17. Successive stability bands 100, 110, and 120 (shown hi FIG. 10), coinciding with the arrival of INPUT MEASUREMENT data, are shown superimposed on the INPUT SIGNAL to illustrate the successive attempts of the STABILITY process 40 to track the INPUT SIGNAL and arrive at decisions regarding its stability at any particular time. The lower portion of the graph is a state diagram that shows the reaction of the STABILITY process 40 (shown in FIG. 3) in terms of its output state, output event, and subsequent moving average length responsive to the stability decision regarding the measurement value that arrives in each time period.

During time periods t1 through t9, the INPUT SIGNAL is shown decreasing in voltage level relatively slowly. The moving average based on the last 64 stable measurements can track a slowly changing INPUT SIGNAL and the stability bands 100 and 110 remain centered around the moving average which is recalculated for each measurement.

At time t10, the INPUT SIGNAL drops more rapidly and falls into the MODERATELY UNSTABLE stability band 100, causing the STABILITY process 40 to change the output state 52 (shown in FIG. 4) to unstable and to generate the STOP event 62 (shown in FIG. 5) which is communicated to the WAVEFORM SCAN process. The moving average length drawn from the set 130 is truncated to the last 16 measurements in order to attempt to track the now rapidly changing INPUT SIGNAL.

At time t12, the INPUT SIGNAL falls within the STABLE stability band 120 and the output state 52 again becomes stable. At time 115, the INPUT SIGNAL rises rapidly and in the INPUT SIGNAL falls into the HIGHLY UNSTABLE region, again causing the output state 52 to be changed to unstable and the STOP event 62 to occur as before. The moving average length, again drawn from the set 130, is truncated to the last 4 measurements in order to more quickly track the change in the INPUT SIGNAL. The set 130 of moving average lengths (shown in FIG. 10), which includes 64, 16, and 4, were arrived at through empirical experimentation and system requirements to provide a set of variable response times to quickly adapt to the INPUT SIGNAL newly coupled to the instrument while providing detection of an unstable INPUT SIGNAL so that the measurement of the unstable INPUT SIGNAL that would result in meaningless information being displayed is appropriately rejected. Accordingly, other moving average lengths would also be suitable.

Furthermore, it will be noted that measurements falling below a predetermined THRESHOLD level will cause the output state 52 to be set to unstable, thereby detecting when the test probes 12 have been removed from the device under test 14 (shown in FIG. 1). The THRESHOLD level was arrived at empirically to be the most optimal level to separate low level noise of disconnected test probes 12 from the valid signals of test probes 12 coupled to the desired DUT 14.

It will be obvious to those having ordinary skill in the an that many changes may be made in the details of the above described preferred embodiments of the invention without departing from the spirit of the invention in its broader aspects. For example, the INPUT MEASUREMENT data may be based on measurement technology such as a frequency counter-timer which generates measurements based on frequency, phase, duty cycle, or signal period, among others. Therefore, the scope of the present invention should be determined by the following claims.

What we claim as our invention is:

1. A portable, electronic test instrument having measurement circuitry for measuring an input signal and adapted for displaying only meaningful information during probing operations, comprising:
    (a) an input circuit adapted for receiving signals from a device under test and producing said input signal;
    (b) a first analog-to-digital converter coupled to said input circuit for providing measurements of said input signal;
    (c) a second analog-to-digital converter coupled to said input circuit for providing a waveform scan measurement of said input signal;
    (d) a waveform memory coupled to said second analog-to-digital converter for storing at least two of said waveform scans, including a present waveform scan and a past waveform scan;
    (e) a display device adapted to display said waveform scans as graphical waveforms; and
    (f) a microprocessor coupled to said first analog-to-digital converter to receive said measurements from said first analog-to-digital converter to detect when said input signal is stable; said microprocessor also coupled between said waveform memory and said display device to control the selection of said waveform measurements provided to said display device from said waveform memory wherein said present waveform is provided to said display device when said input signal is stable and said past waveform is provided to said display device when said input signal is not stable.

2. A portable, electronic test instrument according to claim 1, said waveform memory further adapted to store three waveform scans in three buffers wherein one buffer is dynamically selected for a display waveform, a second buffer is dynamically selected to receive the present waveform scan, and a third buffer is dynamically selected to store a past waveform scan.

3. In an electronic instrument, a method for determining the stability of an input signal, comprising:
    (a) digitally sampling said input signal at regular intervals to produce a series of measurement values;
    (b) calculating a moving average of a predetermined length of said series of measurement values;
    (c) placing a plurality of stability bands centered around said moving average;
    (d) comparing a new measurement value to each of said stability bands to determine a relative stability factor of said new measurement value;
    (e) sending an output signal to indicate said relative stability factor; and
    (f) adjusting said length of said moving average responsive to said stability factor wherein said length is proportionately truncated for new measurement values that are less stable.

4. A method for determining the stability of digitally sampled signal according to claim 3 further comprising two stability bands centered around said moving average wherein said relative stability factor comprises one of highly unstable, moderately unstable, and stable determination.

5. A method for determining the stability of digitally sampled signal according to claim 4 wherein said length of said moving average is truncated to four measurements responsive to said relative stability factor that is highly unstable.

6. A method for determining the stability of digitally sampled signal according to claim 4 wherein said length of said moving average is truncated to sixteen measurements responsive to said relative stability factor that is moderately unstable.

7. A method for determining the stability of digitally sampled signal according to claim 4 wherein said length of said moving average is sixty four measurements responsive to said relative stability factor that is stable.

8. A method for determining the stability of digitally sampled signal according to claim 3 wherein said output signal further comprises an output state and an output event.

9. A method for determining the stability of digitally sampled signal according to claim 3 wherein said output state further comprises one of stable and unstable.

10. In an electronic test instrument having measurement circuitry for measuring an input signal, a method for displaying only meaningful waveform information, comprising:

(a) measuring said input signal with a waveform measurement process according to a first parameter to provide input waveforms;

(b) providing a waveform memory adapted to store at least two of said input waveforms from said waveform measurement process, including a present waveform and a last waveform;

(c) providing a display for visually displaying each of said input waveforms received from said waveform memory;

(d) independently measuring said input signal with a second measurement process according to a second parameter to produce input measurement data wherein said first and second parameters each independently comprise a selected one of a plurality of signal parameters;

(e) making a decision about said input signal from a plurality of said input measurement data received from said second measurement process, said decision having an output status that is one of stable and unstable;

(f) providing said present waveform from said waveform memory to said display if said output status is stable and saving said present measurement as said last waveform; and (g) providing said last waveform from said waveform memory to said display if said output status is unstable and discarding said present waveform.

11. A method for displaying only meaningful waveform information according to claim 10 wherein each of said input waveforms comprises a predetermined number of samples of said input signal collected during a waveform scan.

12. A method for displaying only meaningful waveform information according to claim 11 wherein said waveform measurement process further comprises:

(a) receiving a trigger signal to begin said waveform scan;

(b) conducting said waveform scan as long as said output status is stable wherein said input signal is successively sampled and stored as said present measurement in said waveform memory; and (c) terminating said waveform scan if said output status becomes unstable.

13. A method for displaying only meaningful waveform information according to claim 10 wherein said display further comprises a pixel-addressable display module adapted for visually displaying waveform measurements.

* * * * *